(12) United States Patent
Wong

(10) Patent No.: US 9,740,225 B1
(45) Date of Patent: Aug. 22, 2017

(54) LOW DROPOUT REGULATOR WITH REPLICA FEEDBACK FREQUENCY COMPENSATION

(71) Applicant: Avago Technologies General IP (Singapore) Pte. Ltd.

(72) Inventor: Kian Tiong Wong, Skudai (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/136,792

(22) Filed: Apr. 22, 2016

Related U.S. Application Data

(60) Provisional application No. 62/299,393, filed on Feb. 24, 2016.

(51) Int. Cl.
| | | |
|---|---|---|
| *G05F 1/575* | (2006.01) | |
| *G05F 1/46* | (2006.01) | |
| *H03G 3/00* | (2006.01) | |
| *G05F 1/565* | (2006.01) | |
| *H03F 3/21* | (2006.01) | |
| *H02M 3/158* | (2006.01) | |
| *G05F 3/26* | (2006.01) | |

(52) U.S. Cl.
CPC .............. *G05F 1/575* (2013.01); *G05F 1/468* (2013.01); *G05F 1/565* (2013.01); *G05F 3/26* (2013.01); *H02M 3/1582* (2013.01); *H03F 3/21* (2013.01); *H03G 3/004* (2013.01)

(58) Field of Classification Search
CPC . G05F 1/575; G05F 1/565; G05F 3/26; H03F 3/21; H03G 3/004; H02M 3/1582
See application file for complete search history.

(56) References Cited

U.S. PATENT DOCUMENTS

| | | | | |
|---|---|---|---|---|
| 8,981,746 B2* | 3/2015 | Napravnik | .............. | G05F 1/575 323/274 |
| 9,223,329 B2* | 12/2015 | Pulvirenti | ................. | G05F 1/56 |
| 9,395,731 B2* | 7/2016 | Bhattad | ..................... | G05F 1/56 |

* cited by examiner

*Primary Examiner* — Emily P Pham
(74) *Attorney, Agent, or Firm* — Sterne, Kessler, Goldstein & Fox P.L.L.C.

(57) ABSTRACT

Methods, systems, and apparatuses are described for a low dropout voltage regulator that utilizes a replica feedback frequency compensation technique to provide enhanced stability to the low dropout voltage regulator such that the low dropout voltage regulator does not need to be externally compensated with a large capacitor (e.g., larger than 4 microfarads). Rather, a small capacitor (e.g., 4 microfarads or smaller) may be used.

20 Claims, 8 Drawing Sheets

LOW DROPOUT REGULATOR WITH REPLICA FEEDBACK FREQUENCY COMPENSATION

CROSS-REFERENCE TO RELATED APPLICATIONS

This application claims priority to the following application, which is incorporated by reference herein in its entirety: U.S. Provisional Application No. 62/299,393, entitled "Low Dropout Regulator with Replica Feedback Frequency Compensation," filed on Feb. 24, 2016.

BACKGROUND

Technical Field

The subject matter described herein relates to voltage regulators, and in particular to low dropout regulators.

Description of Related Art

There is an increasing demand for electronic devices to be smaller, faster, and more efficient. To meet such a demand, higher performing power supply circuits, including voltage regulators, are needed. Due to spacing constraints of portable devices, circuits for multiple functions may require multiple voltage levels on the same chip. Therefore, voltage regulators are utilized to protect circuits from fluctuations in the power supply that may occur from crosstalk or digital switching. High fluctuations in the power supply are not desirable because they may damage sensitive circuit components, disrupt biasing or prevent circuits from working.

To regulate an output voltage from a higher input voltage, a voltage regulator may compare its output voltage with a fixed reference voltage, amplify the difference, and use feedback to match the output voltage to the reference voltage. There are several types of voltage regulators, namely switching regulators, linear regulators, and cascaded regulators that comprise both switching and linear regulators in cascaded architecture. A special type of linear regulators is a low dropout (LDO) regulator, which has a characteristically low dropout voltage, the minimum voltage required across the regulator to maintain regulation.

LDO regulators are favored in portable applications, particularly mobile products that are battery powered, such as cellular phones, camera recorders and laptops. To increase battery life and efficiency, these portable electronic devices require low voltage and low quiescent current flow, which is the current required to power the internal circuitry of the LDO when the external load current is zero. Low voltage is a natural consequence of improving chip process technology that leads to higher packing densities. Thus, voltage regulators that operate at low voltages and low quiescent currents while producing precise output voltages are desirable.

Many factors have to be considered in designing an LDO regulator for optimum performance in a power supply system while reducing total system cost. These factors may include dropout voltage, quiescent current, efficiency, load transient response, power supply rejection, bandwidth and stability. These factors may be competing factors that make the design process of a high performance LDO a challenging one.

BRIEF SUMMARY

Methods, systems, and apparatuses are described for a low dropout voltage regulator that utilizes a replica feedback frequency compensation technique, substantially as shown in and/or described in connection with at least one of the figures, as set forth more completely in the claims.

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form a part of the specification, illustrate a plurality of embodiments and, together with the description, further serve to explain the principles involved and to enable a person skilled in the pertinent art(s) to make and use the disclosed technologies. However, embodiments are not limited to the specific implementations disclosed herein. Unless expressly indicated by common numbering, each figure represents a different embodiment where components and steps in each embodiment are intentionally numbered differently compared to potentially similar components in other embodiments. The left-most digit(s) of a reference number identifies the number of the figure in which the reference number first appears.

Figure 1:
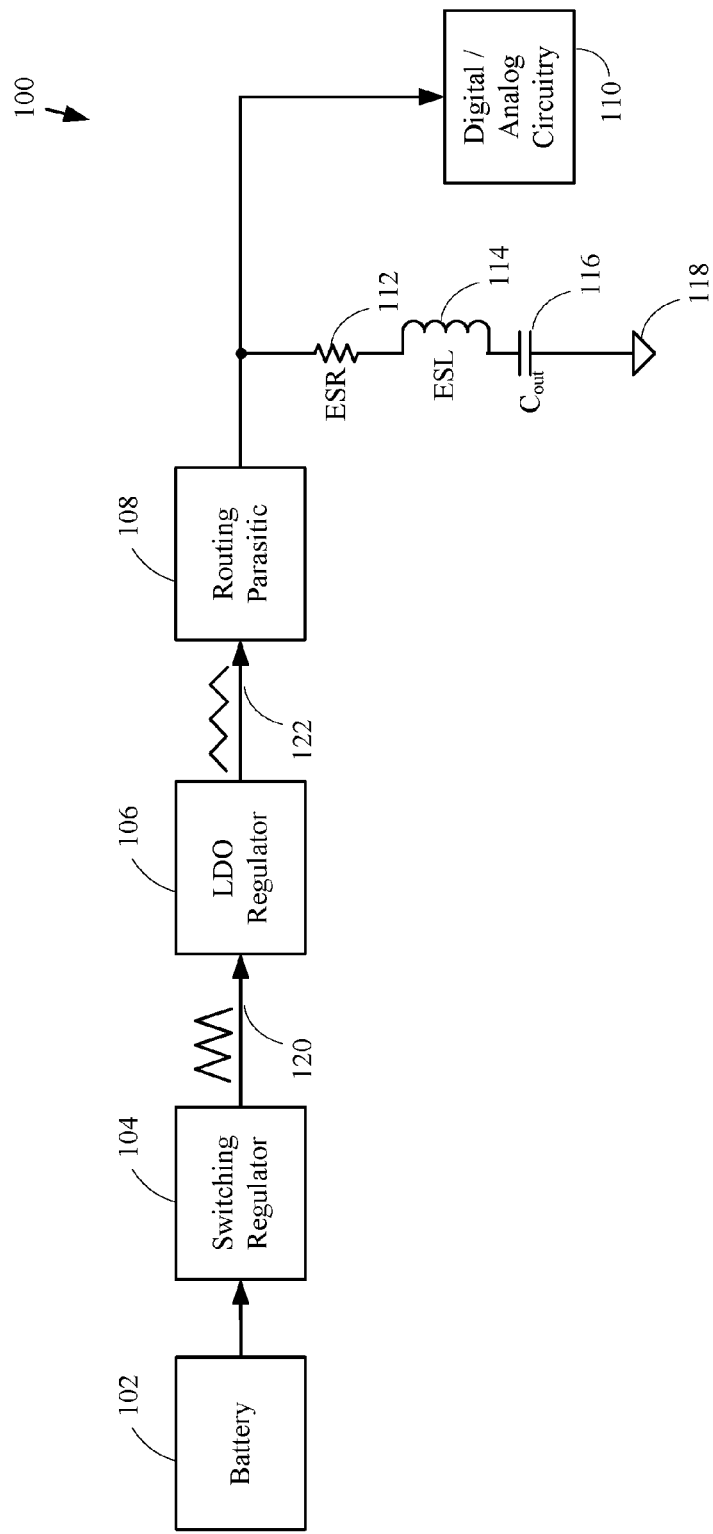
FIG. 1 is a block diagram of a system that includes an LDO regulator.

Exemplary embodiments will now be described with reference to the accompanying drawings.

DETAILED DESCRIPTION

Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection or through an indirect electrical connection via other devices and connections.

Embodiments of systems, devices and methods may be implemented in various architectures, each with various configurations. Several detailed features and embodiments are discussed below. Functionality may be referenced as logic, components, modules, circuits and the like. Functionality may be implemented in digital, analog or combined components. Functionality may be implemented in hardware, software or a combination thereof.

Example Embodiments

A. Characteristics and Design Parameters of an LDO in a Regulator System

The low dropout regulator (LDO) is named for the small difference between its required supply voltage and the desired output voltage. A regulator that has a dropout voltage of one volt (V) or less may be considered a low dropout regulator. For example, an LDO may be used in an application that requires a 3.3 V output from a 3.6 V battery. In this example, the LDO must have a dropout voltage of 300 mV or less because the input voltage minus the voltage drop across the LDO equals the output voltage. Additionally, an LDO may be characterized as high power or low power. High power LDOs can yield currents that are equal to or greater than 1 ampere (A) to the output, thus these LDOs are also referred to as LDOs with a high current rating. In contrast, low power LDOs typically have a maximum output current of less than 1 A.

An LDO tends to have a high output impedance so it may be less stable than other linear regulators. Thus, a large externally-coupled capacitor that provides a dominant pole at the output to lower the output impedance of the LDO may be used with the LDO to compensate for the instability. FIG. 1 is a block level diagram of a system 100 depicting an LDO topology that includes an output capacitor. System 100 may include a battery 102 connected to a switching regulator 104 that is connected to an LDO 106, which is coupled to a load 110 and an output capacitor 116.

Battery 102 supplies a DC voltage to system 100. Battery 102 may be any type of battery, for example, lithium-based, nickel-based, rechargeable or non-rechargeable. Battery 102 is coupled to switching regulator 104. The requirements of the system dictate the specifications of the battery. For example, battery 102 may provide switching regulator 104 with a 3.7 V voltage.

Switching regulator 104 is configured to receive the 3.7 V voltage from battery 102 and to output a voltage 120 to LDO 106. A switching regulator may include a controller with an oscillator, one or more pass elements, inductors (Ls), capacitors (Cs) and diodes. A switching regulator receives a direct current (DC) voltage and converts it into a high-frequency alternating current (AC) voltage. This conversion is performed by a switch (e.g., a transistor) that connects the unregulated input voltage to a storage element (e.g., an inductor), and the switch is rapidly toggled between on and off, causing an AC ripple at the output of the storage element. The AC ripple may be low-pass filtered via an LC network to produce a DC voltage at the output. Switching regulators are known to have high power efficiency (e.g., 80% to 95%) and can generate larger output voltages than the input depending on the circuit configuration (e.g., buck or boost), which is something that cannot be accomplished with other types of regulators without a charge pump. However, the DC to AC conversion of the switching regulator causes a high output voltage ripple despite the low pass filtering. In addition, the inductors used in switching regulators require external board room because they are often too large to be integrated onto a chip. Thus, switching regulators are not suitable for circuits that are highly sensitive to supply voltage fluctuations.

However, switching and linear regulators may be combined in a cascaded architecture to take advantage of their desirable characteristics, as is the case here in system 100. In a cascaded regulator, the switching regulator can set a rough DC level, above or below the original unregulated supply as needed. Then, the LDO is used to reduce the ripple of the output of the switching regulator to allow for a more stable configuration for a wide range of loads as well as shorter response times with load changes. The disadvantages of the cascaded regulator are the increased area and power consumption due to having two regulators as compared to a single regulator.

To continue with the above example, switching regulator 104 may be used to reduce the input voltage of 3.7 V and to output 1.22 V to LDO 106. An LDO in its most basic form may include an input voltage that is applied to a pass element (e.g., a transistor), which drops the input voltage down to the desired output voltage. The resulting output voltage is fed back to an amplifier, which compares the output voltage to a reference voltage. The amplifier drives the gate of the pass element to the appropriate operating point to ensure that the output is at the correct voltage. As the input supply voltage changes, the amplifier modulates the pass element to maintain a constant output voltage. Under steady state operation, an LDO behaves like a current source. Thus, in system 100, LDO 106 may provide a clean, noise-free voltage 122 to load 110. For example, voltage 122 may be 1.1 V. Load 110 may be any digital and/or analog circuitry, component or device that may be driven by an electrical current.

Capacitor 116 is externally coupled to the output of LDO 106 and ground 118. Capacitor 116 may be any type of capacitor, such as ceramic, tantalum, or aluminum electrolytic. Ceramic capacitors are commonly used because of their low cost and smaller footprint size. However, depending on the application, other types of capacitors may be used.

A capacitor with a capacitance in the range of a few microfarads, for example, larger than 4 µF, may be considered a large output capacitor. A capacitor may be considered small if its capacitance is in the range of 1-4 µf. A large output capacitor is necessary to significantly improve the characteristics (e.g., load transient response, power supply noise rejection (PSR), and stability) of the LDO. Due to its bulky size and non-idealities, the output capacitor may cause undesirable effects such as increasing the integrated circuit (IC) pin count(s) in system on chip (SOC) applications, occupying valuable board space, and negatively impacting reliability. Non-idealities of capacitor 116 may include a parasitic effective series resistance (ESR) 112 and an effective series inductance (ESL) 114. ESL 114 can restrict performance of capacitor 116 at high frequency. ESR 112 represents the impedance of the output capacitance, and typically a lower ESR value is desired. However, if the ESR is too small, it becomes a dominant pole that can reduce phase margin, thereby causing a degradation in the system dynamic response. In contrast, if the ESR is too large, it can create a zero that extends the unity gain frequency in the closed loop. Thus, the zero can negatively impact the phase margin and cause the system to become unstable.

Furthermore, system 100 may include routing parasitic resistance 108 associated with the routing wires or traces from the output of LDO 106 to load 110. Routing parasitic resistance 108 in combination with ESR 112 and output capacitor 116 affects the zero location and consequently the phase margin and stability of system 100 in accordance with the following equations.

$$\text{ESR zero}: z_{ESR} \approx -\frac{1}{(ESR_{cap} + ESR_{routing})C_{out}}$$

$$\text{Complex zero}: z_{Complex} \approx \pm \frac{j}{\sqrt{(ESL_{cap} + ESL_{routing})C_{out}}}$$

Due to the lower voltage drop requirements for LDOs with high current rating, the ESR zero may be assumed to be located a higher frequency than the complex zero, and thus has less of an effect on transient performance.

The following are some characteristics and parameters that are important in an LDO.

a. Dropout voltage is the input-to-output voltage difference, the minimum voltage required for the LDO to maintain regulation. A low dropout voltage maximizes the LDO efficiency because it can lower the required voltage of the unregulated power supply, and in turns lowers the power consumption of the regulator.

b. Headroom voltage is the input-to-output difference required for an LDO to meet its specification. The headroom voltage may be around 400 mV to 500 mV, although it can be as high as 1.5 V for some LDOs.

c. Quiescent current is the current required to power the internal circuitry of the LDO when the external load current is zero. The amount of quiescent current is determined by the topology, input voltage, and temperature. Ground current is the difference between the input and output currents, and includes the quiescent current. A low ground current maximizes the LDO efficiency.

d. Efficiency of the LDO is determined by the ground current, input and output voltages. To maximize efficiency, the headroom voltage and ground current must be minimized along with the difference between the input and output voltages. The input-to-output voltage is a factor in determining efficiency while not taking into account the load conditions.

e. DC load regulation is a measurement of the ability of the LDO to maintain the required output voltage under different load conditions.

f. DC line regulation is a measurement of the ability of the LDO to maintain the specified output voltage with varying input voltage. The line regulation worsens as the load current increases because the overall loop gain of the LDO decreases.

g. DC accuracy is affected by the line-and-load regulation, reference voltage drift, and amplifier voltage drift. The output voltage variation in a regulated power supply is primarily due to temperature variation of the reference voltage and the amplifier.

h. Load transient response is the output voltage variation for a load current step change and is a function of the output capacitor value, its ESR, the gain-bandwidth of a main loop of the LDO, and the size and slew rate of the load current change. The terms "main loop," "control loop," or "regulating loop" may herein be used interchangeably. The slew rate strongly contributes to the load transient response. If the load transient is very slow (e.g., 100 mA/µs), the main loop of the LDO may be able to follow the change. If, however, the load transient is faster than the LDO can compensate, excessive ringing may occur due to low phase margin.

i. Line transient response is the output voltage variation for an input voltage step change and is a function of the gain-bandwidth of the main loop of the LDO and the size and slew rate of the input voltage change. The slew rate of the input voltage has a large effect on the line transient response. A slowly changing input voltage (e.g., one that is within the bandwidth of the LDO) can mask ringing or other undesirable behavior.

j. Power supply noise rejection is a measurement of how well noise and ripple on the power supply input are suppressed. Power supply rejection ratio (PSRR) is defined to be the magnitude in decibels (dB) of the gain from the positive power supply to the LDO output for low frequencies (e.g., 100 kilohertz (kHz) to 1 megahertz (MHz)). The main loop of the LDO tends to be a strong contributing factor in determining power supply rejection. High value, low ESR capacitors may be beneficial, especially at frequencies beyond the gain-bandwidth of the main loop. PSRR is defined by a range of frequency, rather than a single value, because it is frequency dependent. The AC gain of the amplifier in the LDO is a dominating factor in determining the PSRR. The PSRR of an LDO may be characterized as having: (1) a reference PSRR region, (2) an open-loop gain region, and (3) an output capacitor region. In the first region, the PSRR is largely determined on the PSRR of the reference amplifier and the open-loop gain of the LDO. In the second region, the PSRR is dominated by the open-loop gain of the LDO and is a function of the amplifier gain-bandwidth up to the unity gain frequency (UGF), the frequency at which the gain is 0 dB. Above the UGF of the amplifier, the feedback of the main loop has no effect on the PSRR, which is then determined by the output capacitor and parasitics between the input and output voltages. In other words, the ESR, ESL and the board layout/routing affect the PSRR in the third region. The load current affects the gain-bandwidth of the amplifier feedback loop, and in turn affects the PSRR. At light load currents (e.g., less than 50 mA), the output impedance of the pass element is high. The pole formed by the output capacitor and the pass element occurs at relatively low frequency, so PSRR tends to increase at low frequencies. At heavy load currents, the output impedance of the pass element decreases, lowering the gain of the output stage and reducing the PSRR between the DC and the unity gain frequency of the feedback loop. PSRR can decrease dramatically as the load current rises. The output stage bandwidth increase as the frequency of the output pole increases. In theory, PSRR should increase due to the increased bandwidth at high frequencies, but in practice, the high-frequency PSRR may not improve because of the decrease in overall loop gain. Thus, in general, PSRR is better at light loads than heavy loads.

In designing an LDO, many of the above factors must be considered. Desirable characteristics include minimized power consumption for battery longevity; efficiency that is maximized by a low dropout voltage; decreasing footprint size to achieve a smaller, more portable device; high bandwidth to enable faster response to changes in input and power supply while keeping output voltage constant; high power supply noise rejection; enhanced stability indicated by a good phase margin (e.g., greater than 45 degrees) for a wide range of output loads.

Different techniques may be utilized to enhance the stability of the LDO by, for example, manipulating the locations of the poles and zeros to push poles to higher frequencies, using a large external output capacitor or performing some other frequency compensation technique. The following sections describe different LDO topologies and their comparative performance in terms of the above parameters. The LDO architectures include: (1) an LDO designed to be supported by a large output capacitor, (2) an LDO designed with a lead-lag pole-zero pair, and (3) an LDO that utilizes a replica feedback frequency compensation technique.

B. Example of a System Having an LDO Regulator with a Large Output Capacitor

Cost is an aspect that has to be contemplated in most designs, and the design of an LDO system, such as system 100, is no exception. To reduce cost, an LDO may be designed to work without an output capacitor. However, the absence of the output capacitor can result in degradation of system performance, particularly with respect to transient performance and power supply noise rejection.

In another approach, a smaller, less expensive output capacitor may be used instead of a larger output capacitor. An inexpensive capacitor, however, has a highly variable capacitance that is dependent on the temperature and applied voltage. The characteristic of change in capacitance according to the applied AC voltage is called the DC bias. There are four methods of field enhancement or polarization that take place in a capacitor dielectric material, including electronic, atomic, dipole, and space charge. Many dielectrics are dominated by the dipole or orientation polarization mechanism. For example, at 0 V DC, the orientation mechanism of the applied AC voltage causes most of the dipoles to flip back and forth with the AC voltage. Applying a DC voltage causes some of the dipoles to be locked in place, preventing the AC voltage from reorienting them. A further increase of the DC voltage causes more dipoles to be locked, resulting in even fewer dipoles in the dielectric that may be reoriented with the AC voltage. This drop in dipoles reduces the contribution of the dipoles to the dielectric constant value, which is directly related to the number of spontaneous dipoles per unit volume in a material. The more dipoles that are aligned to the applied AC field, the higher the capacitance. When the dipoles are locked up, the capacitance is lowered. Thus, an inexpensive, smaller output capacitor may suffer from a lower effective capacitance due to the DC bias, and in turn, degrade the system performance (e.g., LDO stability, power supply noise rejection, and load transient response).

Figure 2:
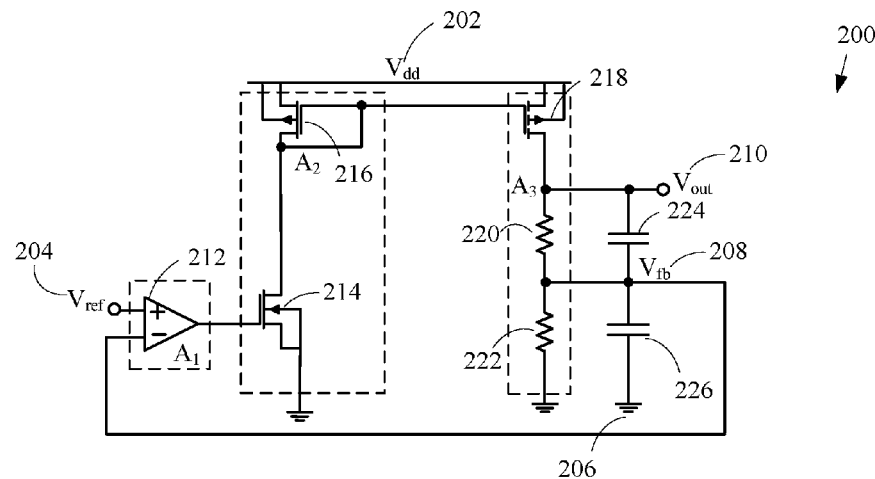
FIG. 2 is a schematic of an LDO regulator circuit that may be used with a large output capacitor.

Given the above, in most cases, the LDO system is designed to include an external output capacitor. FIG. 2 is a schematic that depicts an LDO 200 circuit designed to be compensated with an output capacitor, such as capacitor 116 shown in FIG. 1. LDO 200 may include an amplifier 212, a transistor 214, a transistor 216, a transistor 218, a resistor 220, a resistor 222, a capacitor 224, and a capacitor 226.

Amplifier 212 has a reference voltage 204 and feedback voltage 208 as inputs. For example, reference voltage 204 may be provided to a non-inverting input of amplifier 212 and feedback voltage 208 may be provided to an inverting input of amplifier 212. Amplifier 212 compares the two voltages, amplifies their difference, and outputs a voltage that drives the gate of transistor 214. Reference voltage 204 provides a stable DC bias voltage. Reference voltage 204 may be implement in many ways, for example, by a diode (e.g., Zener) or a bandgap reference circuit. The Zener diode may be preferred for applications with high voltage (e.g., greater than 7 V) circuits having relaxed temperature variation requirements. In contrast, the bandgap reference circuit may be more suitable for low-voltage applications that require high accuracy. Feedback voltage 208 is a scaled version of an output voltage 210 of LDO 200. More specifically, output voltage 210 is divided by a voltage divider comprising of resistor 220 and resistor 222 to generate feedback voltage 208. Capacitors 224 and 226 are placed in parallel with resistors 220 and 222, respectively.

Transistor 218 is shown in FIG. 2 as having a source connected to an input voltage 202 ($V_{dd}$) and a drain at output voltage 210 of LDO 200. Transistor 218 serves to drop input voltage 202 to the desired output voltage. Transistor 218 may be referred to as a pass element or power transistor. Transistor 214 may be an n-type metal oxide semiconductor field effect transistor (MOSFET) or nMOS and transistors 216 and 218 may be p-type MOSFETs or pMOS. Alternatively, transistor 214 may be a pMOS and transistors 216 and 218 may be nMOS. A pMOS transistor is best suited for low quiescent current flow (ground current) applications. However, these transistors may be implemented with other devices, such as an nMOS, a bipolar transistor (NPN or PNP), or an NPN Darlington pair transistor.

While not shown in FIG. 2, an output capacitor may be externally connected between the output of LDO 200 and ground 206. Such an external output capacitor may be, for example, capacitor 116 shown in FIG. 1. The output capacitor may be a large capacitor having a capacitance that is greater than 1 µf.

A main loop of LDO 200 includes a feed forward path starting at amplifier 212 and ending at transistor 218, and a feedback path from the feedback network of resistors 220 and 222 and capacitors 224 and 226. This main loop along with the load (output capacitor and associated ESR, load-current and associated output impedance, and any bypass capacitors) determines the frequency response of LDO 200. The overall transient response is affected by the unity gain crossover frequency and stability of the LDO. A stable LDO will have a smooth, controlled transient response. The internal compensation for an LDO is fixed. However, the stability of the LDO may be adjusted or compensated using the output capacitor, which may be specifically selected to ensure stability.

Figure 3:
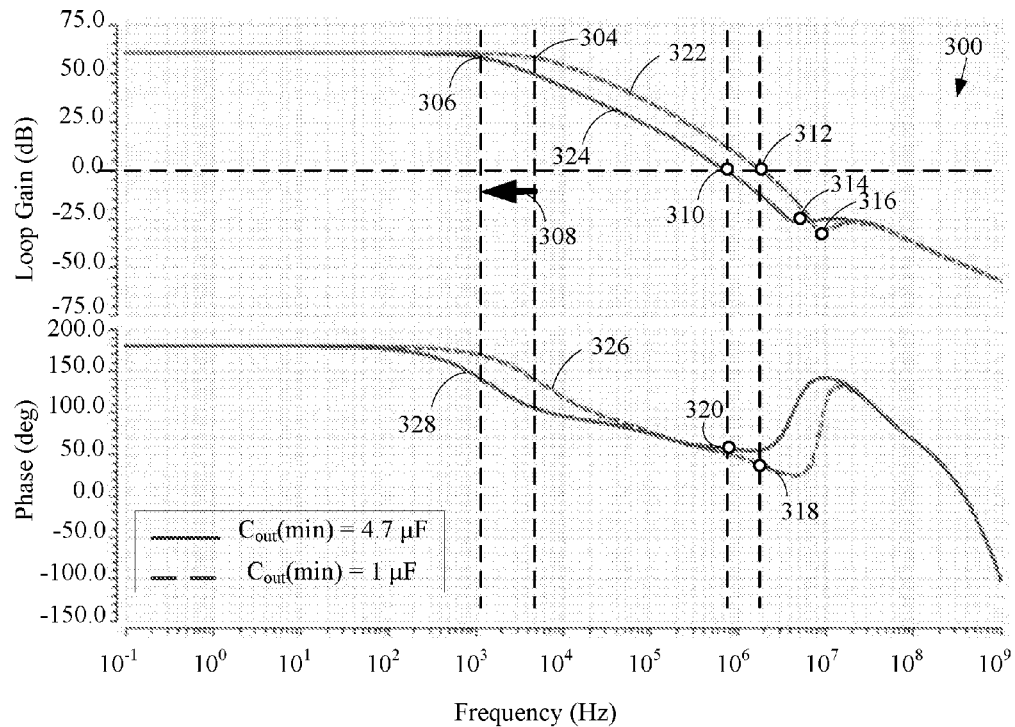
FIG. 3 is a Bode plot of the LDO regulator of FIG. 2 for analyzing the stabilizing effect of an output capacitor.

FIG. 3 is a Bode plot 300 for analyzing the stabilizing effect of an output capacitor. A Bode plot presents a visual representation of the behaviors of the poles and zeros of a system, which can determine loop stability. A pole decreases the loop gain slope by −20 dB/decade at its pole frequency, $f_p$. It also introduces a −90° phase shift (counter clockwise) from the frequency one decade below $f_p$ ($f_p/10$) to the frequency one decade above $f_p$($10f_p$), with a phase shift of −45° at G. The loop gain slopes decrease and the phase shifts are additive. Thus, each additional pole decreases the loop gain slope by another −20 dB/decade, and increases the phase shift by an additional −90°. The pole may be modeled by a resistor and capacitor (RC) pair in low-pass filter configuration. In contrast, a zero increases the loop gain slope by +20 dB/decade at its zero frequency ($f_z$). It also introduces a +90° phase shift (clockwise) from the frequency one decade below $f_z$ ($F_z/10$) to the frequency one decade above $f_z$ ($10\ f_z$), with a +45° phase shift at $f_z$. Loop gain slope increase and phase shift created by a zero are additive. An RC pair in a high-pass filter configuration may be used to model a zero.

Phase margin is an important stability indicator of a closed loop and is defined to be the difference (in degrees) between −180° and the total phase shift of the loop at the frequency where the loop gain is 0 dB (unity gain). In general, a loop is considered to be stable if the phase margin is 45° or more. If a 45° phase cannot be achieved by the intrinsic architecture of the LDO, some form of compensation, external or internal, is needed.

For LDO 200, the closed loop is the main loop discussed above. Returning to FIG. 3, Bode plot 300 includes loop gain curves 304 and 306, and phase shift curves 326 and 328. These curves track the movements of poles and zeros created by the impedances of the components of two different LDO systems. The loop gain (in decibels) and phase shift (in degrees) are indicated on the y-axis and the frequency (in Hertz) is indicated on the x-axis.

Curves 324 and 328 correspond to a first LDO system that includes a large output capacitor of 4.7 µf, and curves 322 and 326 (shown in FIG. 3 as dashed curves) correspond to a second LDO system that includes a small output capacitor of 1 µF. While the large output capacitor is selected to have a capacitance of 4.7 µf, after considering the DC bias at 1.1 V, aging, temperature effect and tolerance, the equivalent or effective minimum capacitance became 2.1 µf. The same factors also cause the capacitance of the small output capacitor to be reduced from 1 µF to 0.5 µf.

For the first LDO system, dominant pole 304 indicated on curve 322, may be approximated to be the following:

$$\cong \frac{-1}{R_L \times 0.5\mu F}$$

where $R_L$ represents the output resistance of the load at the output of the LDO.

For the second LDO system, dominant pole 306 indicated on curve 324, may be approximated to be the following:

$$\cong \frac{-1}{R_L \times 2.1\mu F}$$

where $R_L$ represents the output resistance of the load at the output of the LDO.

In comparing the two LDO systems, the second LDO system has the dominant pole at a higher frequency than the first LDO system. This is because the larger output capacitor causes a shift of the dominant pole from a higher frequency to a lower frequency as indicated by arrow 308 in FIG. 3. The shifting of the pole affects the closed-loop bandwidth of the system, which is equivalent to the unity gain frequency (UGF). Bode plot 300 shows the UGF, also known as unity gain bandwidth (UGB), for the first LDO system at about 702.26 kHz at marker 310 on curve 324, and for the second LDO system at 1.84 MHz at marker 312 on curve 322. The load regulation performance of both first and second LDO systems is limited by the UGB. The minimum UGB is bounded by the response time required to yield an allowable output voltage variation during a transient load-current step, and the maximum UGB is bounded by the parasitic poles of the LDO system. That is, the pole caused by the output impedance of the amplifier (e.g., amplifier 212 shown in FIG. 2) and the parasitic capacitance introduced by the pass element (e.g., transistor 218 shown in FIG. 2) and internal poles of the amplifier. Thus the LDO system has a slow response time if the UGB is low, but as the UGB approaches the maximum boundary, the LDO system becomes more unstable. Here, with the utilization of the larger output capacitor, the UGB is minimized thereby making the first LDO system more stable at 702.26 kHz than the second LDO system at 1.84 MHz. However, due to the decrease in UGB, the response time for the first LDO system is slower than the second LDO system.

For the first LDO system, complex zero 314 indicated on curve 324, may be approximated to be the following:

$$\pm \frac{j}{\sqrt{L_{esl} \times 2.1\,\mu F}}$$

where $L_{esl}$ represents the effective series inductance of the large output capacitor.

For the second LDO system, complex zero 316 indicated on curve 322, may be approximated to be the following:

$$\pm \frac{j}{\sqrt{L_{esl} \times 0.5\,\mu F}}$$

where $L_{esl}$ represents the effective series inductance of the small output capacitor.

At 702.26 kHz, the phase margin, indicated at marker 320 on curve 328, for the first LDO system is at about 57.63 degrees. At 1.84 MHz, the phase margin, indicated at marker 318 on curve 328, for the second LDO system is at about 37.35 degrees. The phase margin of the first LDO system is therefore higher than the phase margin of the second LDO system. Thus, the large output capacitor substantially improves the phase margin, resulting in a more stable LDO. A large output capacitor is beneficial in an LDO system because it enhances stability and is easy to implement. However, a large output capacitor can worsen the load transient response and can cause a large dip or overshoot in the output voltage in comparison to an LDO system that does not have a large output capacitor.

C. Example LDO Regulator that Includes a Lead-Lag Pole-Zero Pair

Figure 4:
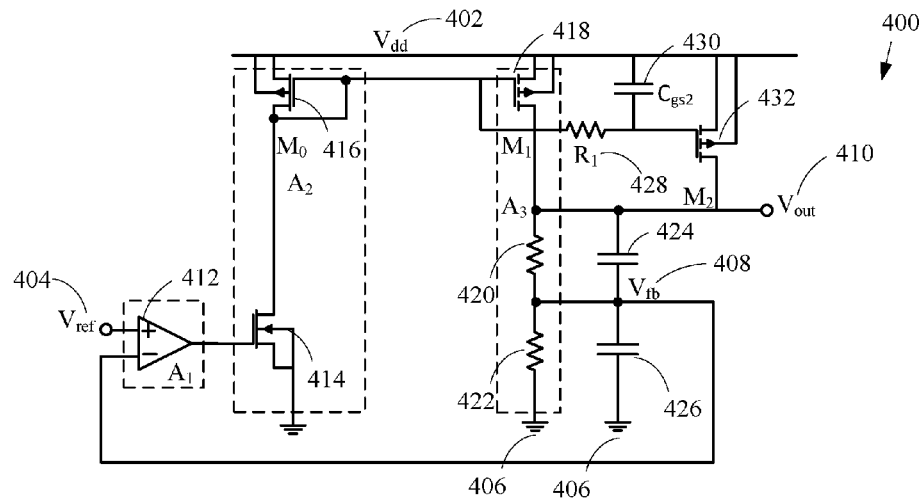
FIG. 4 is a schematic of an LDO regulator circuit that includes a lead-lag pole-zero pair.

Another technique to perform frequency compensation for an LDO includes a lead-lag pole-zero pair. FIG. 4 is a schematic of an LDO 400 designed to include a lead-lag pole-zero pair to enhance the stability of LDO 400. LDO 400 may be supported with an external output capacitor, such as capacitor 116 shown in FIG. 1. LDO 400 may include an amplifier 412, a transistor 414, a transistor 416, a transistor 418, a resistor 420, a resistor 422, a capacitor 424, and a capacitor 426.

Amplifier 412 has a reference voltage 404 and feedback voltage 408 as inputs. For example, reference voltage 404 may be provided to a non-inverting input of amplifier 412 and feedback voltage 408 may be provided to an inverting input of amplifier 412. Amplifier 412 compares the two voltages, amplifies their difference, and outputs a voltage that drives the gate of transistor 414. Reference voltage 404 provides a stable DC bias voltage. Feedback voltage 408 is a scaled version of an output voltage 410 of LDO 400. More specifically, output voltage 410 is divided by a voltage divider comprising of resistor 420 and resistor 422 to generate feedback voltage 408. Capacitors 424 and 426 are placed in parallel with resistors 420 and 422, respectively, with resistor 422 and capacitor 426 being connected to ground 426.

Transistors 418 and 432 are each shown in FIG. 4 as having a source connected to input voltage 402 ($V_{dd}$) and a drain at output voltage 410 of LDO 400. Transistors 418 and 432 may be referred to as pass elements or power transistors, which must be physically large enough to yield high output currents and low dropout voltage characteristics. Transistors 418 and 432 serve to drop input voltage 402 to the desired output voltage. As noted above, a pMOS transistor is best suited for low quiescent current flow applications. For example, transistor 414 may be an nMOS and transistors 416, 418, and 432 may be pMOS. Alternatively, transistor 414 may be a pMOS and transistors 416, 418, and 432 may be nMOS. However, these transistors may be implemented as other devices, such as bipolar transistors (NPN or PNP), or NPN Darlington pair transistors.

In the circuit of LDO 400, there is a gate-to-source parasitic capacitance ($C_{gs2}$) of transistor 432 represented by capacitor 430 and resistor 428 ($R_1$). These two components form a lead-lag pole-zero pair and can be approximated as follows:

$$\text{pole}: p_{lead} \approx -\frac{1}{R_1 C_{gs2}}$$

$$\text{zero}: z_{lag} \approx -\left(1 + \frac{g_{m2}}{g_{m1}}\right) p_{lead}$$

Figure 5:
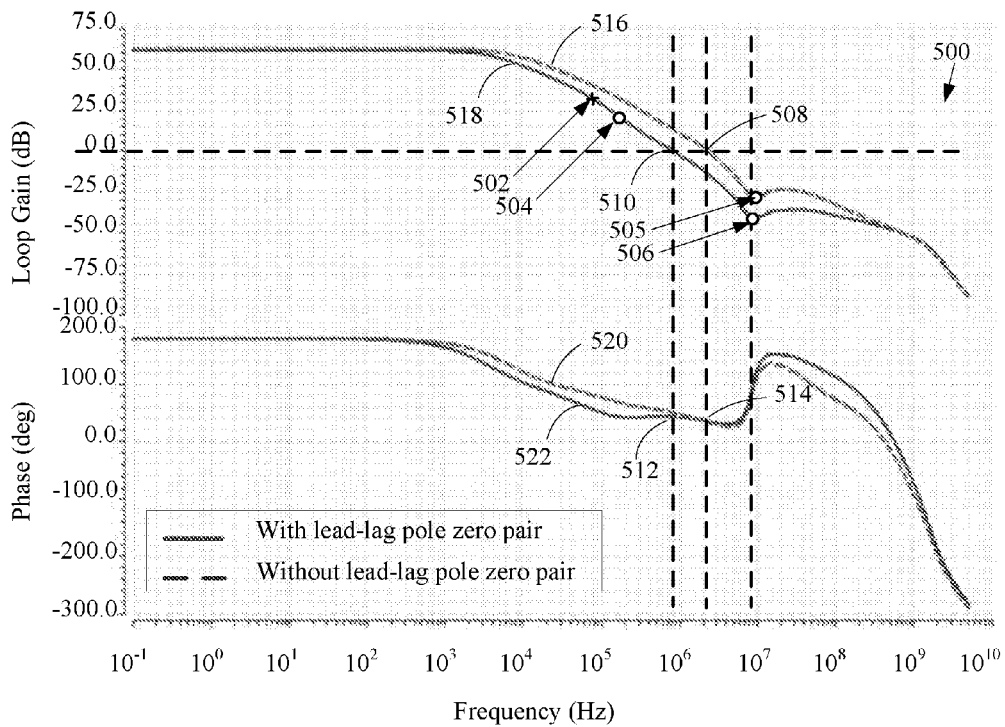
FIG. 5 is a Bode plot of the LDO regulator of FIG. 4 for analyzing the stabilizing effect of the lead-lag pole-zero pair.

FIG. 5 is a Bode plot 500 of an LDO regulator for analyzing the stabilizing effect of the lead-lag pole-zero pair. Bode plot 500 includes loop gain curves 516 and 518 and phase shift curves 520 and 522. The loop gain (in decibels) and phase shift (in degrees) are indicated on the y-axis and the frequency (in Hertz) is indicated on the x-axis.

Curves 518 and 522 correspond to a third LDO system that includes a lead-lag pole-zero pair, such as the one formed by resistor 428 and capacitor 430 shown in FIG. 4. This lead-lag pole-zero pair is shown on curve 518 as lead-lag pole 502 and lead-lag zero 504. Curves 516 and 520 (shown in FIG. 5 as dashed curves) correspond to a fourth LDO system that does not include such a lead-lag pole-zero pair. Curves 516, 518, 520, and 522 track the movements of poles and zeros created by the impedance of the components that form their respective main loops. For example, for LDO 400, the main loop starts with the feed forward path of amplifier 412 and ends with the feedback path of the feedback network that includes resistors 420, 422 and capacitors 424 and 426.

In the third LDO system, the insertion of lead-lag pole 502 causes the gain to rapidly decrease, which is caused by lead-lag zero 504 to pull back the gain. In comparing the third and fourth LDO systems, the third LDO system has a better phase margin due to the insertion of the lead-lag pole-zero pair. As shown in FIG. 5, the third LDO system has a UGB, indicated by a marker 510 on curve 518, at about 798.23 kHz. At 798.23 kHz, the third LDO system has a phase margin of about 43.89 degrees, as indicated by a marker 512 on curve 522. In contrast, the fourth LDO system has a UGB, indicated as a marker 508 on curve 516, at about 2.24 MHz. At 2.24 MHz, the fourth LDO system has a phase margin of about 34.85 degrees, as indicated by a marker 514 on curve 520. Thus, the third LDO system has a higher phase margin than the fourth LDO system and is therefore more stable.

The frequency responses of the third LDO system and fourth LDO system may also be affected by the external output capacitor, which provides a complex zero that causes a gain increase and phase shift. The complex zero 506 of the third LDO system and complex zero 505 of the fourth LDO system may be approximated to be the following:

$$\pm \frac{j}{\sqrt{L_{esl} C_{ext}}}$$

where $L_{esl}$ represents the effective series inductance of the external output capacitor, and $C_{ext}$ represents the capacitance of the external output capacitor.

Thus, the lead-lag pole-zero pair effectively minimizes the UGB, thereby stabilizing the LDO. This pole, zero insertion technique has the advantages of stability and of ease of design. However, this technique results in a worse power supply noise rejection and a worse transient response because of the limited UGB when compared to an LDO without the lead-lag pole-zero pair.

D. Example LDO Regulator that Employs a Replica Feedback Frequency Compensation Technique There are major performance issues with the basic LDO architecture of an amplifier, pass element and a feedback network formed of resistors. This topology has an intrinsically high output impedance due to the operation of the pass device, causing the LDO to appear as a high source impedance to the load. An LDO system includes a fixed frequency pole formed by an internal compensation capacitance and transconductance of the amplifier, an output pole formed by the output elements (output capacitance of output capacitor and load capacitance and resistance), and a parasitic pole formed by parasitic capacitance around the pass element. The output pole can influence the overall frequency response of the LDO in both beneficial and detrimental manners. Stability of the LDO system may be affected by the relative positioning of the poles in the frequency domain. If the poles of such a system are widely separated in terms of frequency, stability may not be an issue. However, the existence of the poles in close proximity may cause oscillations due to low phase margin. While the output capacitor may cause problems by forming a pole with the load resistance and load capacitance, it also forms a zero with the load capacitance and its ESR. The zero serves to mitigate the effect of the output capacitance on stability in certain conditions. For example, if the output pole and zero are appropriately placed in frequency relative to the internal LDO pole, then the detrimental effect may be mitigated. The output capacitance is problematic, however, because the ESR cannot be well-controlled as a parasitic term that is dependent on temperature. This limits the choices for a suitable output capacitor, and often a large output capacitor must be used to maximize stability. However, such a large output capacitor is costly and not desirable if small size is a design requirement.

In an example embodiment, a low dropout regulator is provided that is compensated by a replica feedback frequency (RFFC) technique, which offers internal compensation to the LDO such that a small capacitor may be utilized externally at the output of the LDO. The RFFC technique includes implementing a high pass loop, corresponding to the main loop of the LDO, as well as a low pass loop to ensure output accuracy. Without the RFFC technique, a complex zero of an LDO system causes the main loop gain to decrease significantly before the resonant frequency of the complex zero and the phase margin decreases with the internal pole at the output of the amplifier. The RFFC technique compensates the complex zero and the internal pole to beneficially increase the main loop gain and phase margin. In other example embodiments, a system and method are provided that are directed to an LDO with RFFC compensation and a small output capacitor. Thus, example embodiments provide a stable, high performance LDO system while minimizing size and cost because a small capacitor (e.g., less than 4 microfarads) may be used instead of a large capacitor.

Figure 6:
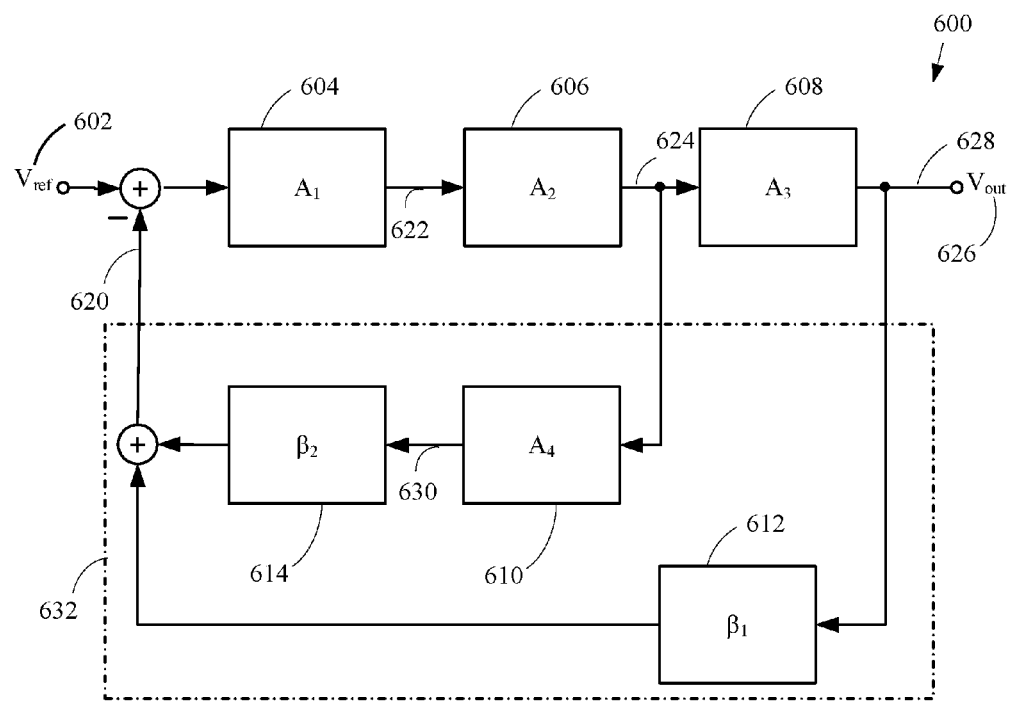
FIG. 6 is a block diagram of an LDO regulator circuit that employs a replica feedback frequency compensation technique according to an example embodiment.

FIG. 6 is a block diagram of a low dropout voltage regulator 600 that is compensated by the RFFC technique. The RFFC technique enhances the stability of the LDO and does not require a large capacitor to be used at the output. Rather, a small external capacitor may be used. LDO 600 includes a first stage 604 ($A_1$), a second stage 606 ($A_2$), a third stage 608 ($A_3$), a fourth stage 610 ($A_4$), a feedback stage 632 that includes first feedback stage 612 that is associated with first feedback factor ($\beta_1$), and a second feedback stage 614 that is associated with second feedback factor ($\beta_2$). First stage 604, second stage 606, third stage 608, and first feedback stage 612 form a main loop of LDO 600. First stage 604, second stage 606, fourth stage 610 and second feedback stage 614 form a replica feedback frequency compensation (RFFC) loop.

First stage 604 has a reference voltage 602 as a first input and a feedback voltage 620 as a second input. First stage 604 generates a first output voltage 622. Second stage 606 receives first output voltage 622 and generates a second output voltage 624. Third stage 608 receives second output voltage 624 and generates a third output voltage 628. Third output voltage 628 is an output voltage at an output terminal 626 of LDO 600. Fourth stage 610 receives second output voltage 624 and generates a fourth output voltage 630. Feedback stage 632 receives third output voltage 628 and fourth output voltage 630 to generate feedback voltage 620. Feedback voltage 620 is therefore controlled by first a feedback factor $\beta_1$ associated with the main loop and second feedback factor $\beta_2$ associated with the RFFC loop. The RFFC technique enables LDO 600 to perform a high pass RFFC loop starting from first stage 604, then second stage 606, then fourth stage 610 and ends with second feedback stage 614 that is associated with second feedback factor $\beta_2$ ($A_1 \rightarrow A_2 \rightarrow A_4 \rightarrow \beta_2$), as well as a low pass loop that begins with first stage 604, then second stage 606, then third stage 608 and ends with first feedback stage 612 that is associated with first feedback factor $\beta_1$ ($A_1 \rightarrow A_2 \rightarrow A_3 \rightarrow \beta_1$). The high pass RFFC loop serves to pull the gain and phase back from a sharp decrease at the 0 dB crossing, and the low pass loop is to ensure output accuracy.

Figure 7:
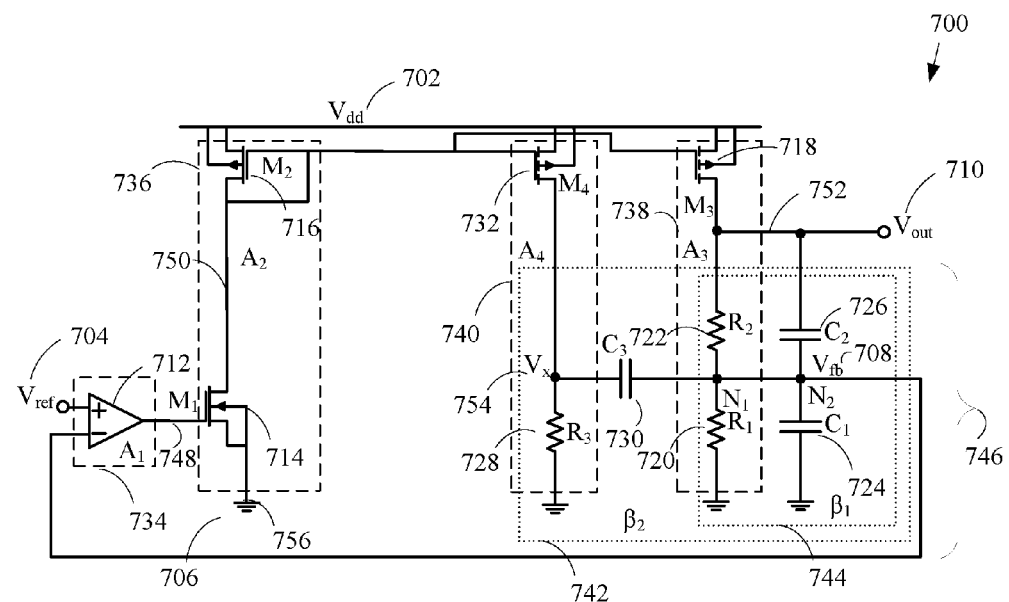
FIG. 7 is a schematic of the LDO regulator circuit of FIG. 6.

LDO 600 may be implemented using an LDO circuit shown in FIG. 7. FIG. 7 shows LDO circuit 700 that includes a first stage 734 ($A_1$), a second stage 736 ($A_2$), a third stage 738 ($A_3$), a fourth stage 740 ($A_4$), and a feedback stage 746. These components correspond, respectively, to first stage 604, second stage 606, third stage 608, fourth stage 610, and feedback stage 632 of LDO 600 of FIG. 6. Feedback stage 746 includes a first feedback circuit 744 that determines first feedback factor $\beta_1$ and a second feedback circuit 742 that determines second feedback factor $\beta_2$. In this implementation, second feedback circuit 742 includes first feedback circuit 744.

First stage 734 has a feedback voltage 708 ($V_{fb}$) as a first input and a reference voltage 704 as a second input. First stage 734 generates a first output voltage 748. First stage 734 includes an amplifier 712 that has a first input connected to feedback voltage 708 and a second input connected to reference voltage 704. In an embodiment, the first input of amplifier 712 is an inverting input and the second input of amplifier 712 is a non-inverting input. In operation, amplifier 712 compares feedback voltage 708 to reference voltage 704, amplifies their difference to produce first output voltage 748, and outputs first output voltage 748 to drive second stage 736. Amplifier 712 may be fabricated in a standard digital complementary metal oxide semiconductor (CMOS) process with low-power circuit techniques. In addition, amplifier 712 may be fabricated with a wideband technique that provides a single, high-impedance node at the output with the actual bandwidth being dependent on desired and available fabrication processes. In an embodiment, a bandwidth from DC to about 1 MHz alternating current AC may be considered "wideband." Low power may also refer to low supply voltage (e.g., 2 V or less) and low bias current level (e.g., 1 µA to 10 µA), which is the current level needed to control a circuit.

Voltage reference 704 may be provided to first stage 734 by any means, for example, a bandgap voltage reference circuit may be used. A bandgap voltage reference circuit produces a fixed voltage regardless of power supply variations and temperature changes. The fixed voltage is a stable DC bias voltage with limited current, suitable for low voltage (e.g., lower than 7 V) and high accuracy applications. Other means may be used to provide voltage reference 704 such as a Zener diode, which is more suitable for high voltage (e.g., greater than 7 V) circuits that can withstand high temperature variations.

Second stage 736 receives first output voltage 748 and generates a second output voltage 750. Second stage 736 includes a first transistor 714 (M₁) and a second transistor 716 (M₂). Transistor 714 has a source terminal, a drain terminal, and a gate terminal. The source terminal of transistor 714 is connected to a ground terminal 706. The gate terminal of transistor 714 is connected to first output voltage 748. Transistor 716 has a source terminal, a drain terminal, and a gate terminal. The source terminal of transistor 716 is connected to a supply voltage 702 ($V_{dd}$). The drain terminal of transistor 716 is connected to the drain terminal of transistor 714, and the gate terminal of transistor 716 is connected to the drain terminal of transistor 716 and to third stage 738 as well as fourth stage 740. In an embodiment, transistor 714 and transistor 716 may be a pair of complementary metal oxide semiconductor (CMOS) transistors. For example, transistor 714 may be an n-channel metal oxide semiconductor (nMOS) transistor and transistor 716 may be a p-channel metal oxide semiconductor (pMOS) transistor, although other types of transistors may be used (e.g., nMOS, bipolar transistors).

Third stage 738 receives second output voltage 750 and generates a third output voltage 752. Third output voltage 752 is an output voltage at an output terminal 710 of LDO 700. Third stage 738 includes a third transistor 718 (M₃) having a source terminal, a drain terminal, and a gate terminal. The source terminal of transistor 718 is connected to supply voltage 702, and the drain terminal of transistor 718 is connected to output terminal 710 of LDO 700. The gate terminal of transistor 718 is connected to second output voltage 750. Supply voltage 702 may be an input voltage that comes from another circuit, device (e.g., a switching regulator) or a battery, such as switching regulator 104 and battery 102 shown in FIG. 1. Transistor 718 operates to drop supply voltage 702 to the desired output voltage.

Transistor 718 may be considered a pass element or a power transistor that is physically large enough to yield high output currents and low dropout voltage characteristic for low power applications. In an embodiment, transistor 718 is a pMOS. A pMOS is a good choice for a pass element because it strikes a good balance between dropout voltage, quiescent current flow, output current, and speed. Transistor 718 may also be implemented with other devices and structures, for example, a Darlington transistor, NPN follower, common emitter lateral PNP, and nMOS follower. A Darlington transistor is a structure that includes two bipolar transistors. Bipolar transistors come in two forms, NPN and PNP. NPN is a transistor that includes a layer of P-doped semiconductor between two N-doped layers. PNP is a transistor that includes a layer of N-doped semiconductor between two P-doped layers. Bipolar transistors can deliver the highest output currents for a given supply voltage. NPN transistors can achieve fast responses and are thus useful for transient load-current steps. PNP transistors are inherently slow in response times. The choice of the pass element is dependent on process technology and required specifications of the LDO.

As shown in FIG. 7, fourth stage 740 receives second output voltage 750 and generates a fourth output voltage 754 ($V_x$). Fourth stage 740 includes a fourth transistor 732 (M₄) having a source terminal, a drain terminal, and a gate terminal. The source terminal of transistor 732 is connected to supply voltage 702. The drain terminal of transistor 732 is connected to one terminal of a third resistor 728 (R₃), and the other terminal of resistor 728 is connected to a ground voltage 756 of ground terminal 706. The gate terminal of transistor 732 is connected to second output voltage 750. In an embodiment, transistor 732 may be a pMOS transistor, although other types of transistors may be used.

In an embodiment, transistor 714 is an nMOS and transistors 716, 718 and 732 are pMOS. In another embodiment, transistor 714 is a pMOS transistor and transistors 716, 718 and 732 are nMOS. However, transistors 714, 716, 718, and 732 may also be implemented with other devices and structures, such as bipolar transistors (NPN or PNP), or NPN Darlington pair transistors.

As further shown in FIG. 7, feedback stage 746 receives fourth output voltage 754 and third output voltage 752 and generates feedback voltage 708 that is controlled by a first feedback factor ($\beta_1$) of a main loop and a second feedback factor ($\beta_2$) of a replica feedback frequency compensation (RFFC) loop of LDO 700. Feedback stage 746 serves to enhance the stability of LDO 700 by increasing the gain of the main loop in its frequency response. In particular, the RFFC loop improves the performance of LDO 700 in high frequencies and provides a gain to compensate the complex zero of LDO 700. In an embodiment, first feedback factor $\beta_1$ is determined by a first feedback circuit 744 comprising a first resistor (R₁) 720, a second resistor 722 (R₂), a first capacitor (C₁) 724, and a second capacitor (C₂) 726. Resistor 720 and resistor 722 are connected at a first node (N₁) and in series between output terminal 710 of LDO 700 and ground terminal 706. Capacitor 724 and capacitor 726 are connected at a second node (N₂) and in series between output terminal 710 of LDO 700 and ground terminal 706. As shown in FIG. 7, the first node is shorted to the second node. Thus, they are essentially the same node. In the same embodiment, second feedback factor $\beta_2$ is determined by first feedback circuit 744 and second feedback circuit 742 that includes first feedback circuit 744, third resistor 728 and a third capacitor (C₃) 730. Resistor 728 has a first terminal that is connected to capacitor 730 a second terminal that is connected to ground terminal 706. Capacitor 730 has a first terminal that is connected to resistor 728 and a second terminal connected to node N₁ in between resistor 720 and resistor 722. In other embodiments, first feedback circuit 744 and second feedback circuit 742 may include the same or different type, number and configuration of electrical components (e.g., resistors and capacitors) as the above embodiment.

The main loop of LDO 700 includes a loop starting with first stage 734, then second stage 736, then third stage 738 and ending with first feedback circuit 744. The main loop of LDO 700 may also be referred to as a low pass loop as its components (resistors and capacitors) resemble a low pass filter in configuration. The RFFC loop of LDO 700 includes a loop starting with first stage 734, then second stage 736, then fourth stage 740, and ending with a second feedback circuit 742 that includes first feedback circuit 744. The RFFC loop may also be referred to as a high pass loop as its components (resistors and capacitors) resemble a high pass filter in configuration.

Second feedback circuit 742, which determines second feedback factor $\beta_2$, when considered by itself in an open loop configuration with $V_x$ and the input and $V_{fb}$ as the output yields the following frequency response:

$$\frac{V_{fb}}{V_x} = \frac{R_1 // R_2 // \frac{1}{s(C_1+C_2)}}{\left(\frac{1}{sC_3} + R_1 // R_2 // \frac{1}{s(C_1+C_2)}\right)}$$

$$= \frac{s(R_1 // R_2)C_3}{(1+s(R_1 // R_2)(C_1+C_2+C_3))}$$

Thus, the zero and pole due to second feedback circuit 742 may be approximated to be the following:

$$\text{Zero}: z \approx 0$$

$$\text{Pole}: p = \frac{-1}{s(R_1 // R_2)(C_1 + C_2 + C_3)}$$

The above high pass pole created by second feedback circuit 742 helps to bring back the decreasing gain of the main loop.

When second feedback circuit 742 is considered in combination with the main loop of LDO 700, the frequency response is then determined to be:

$$\frac{V_{fb}}{V_x} = \frac{\frac{1}{A(s)\beta_1(s)}\left[R_1 // R_2 // \frac{1}{s(C_1+C_2)}\right]}{\left(\frac{1}{sC_3} + \frac{1}{A(s)\beta_1(s)}\right)\left[R_1 // R_2 // \frac{1}{s(C_1+C_2)}\right]}$$

$$= \frac{s[A(s)\beta_1(s)(R_1 // R_2)C_3]}{A(s)\beta_1(s) + s(R_1 // R_2)[A(s)\beta_1(s)(C_1+C_2)+C_3]}$$

where $A(s) = A_1(s)A_2(s)(A_3(s))$.

The zero and pole due to the second feedback circuit 742 may change as follows:

$$\text{Zero}: z \approx 0$$

$$\text{Pole}: p = \frac{-1}{s\frac{(R_1 // R_2)}{A(s)\beta_1(s)}\left(C_1 + C_2 + \frac{C_3}{A(s)\beta_1(s)}\right)}$$

The main loop of LDO 700 has a slow response because the complex zero causes the loop gain to drop significantly before the resonant frequency of the complex zero. In addition, the main loop of LDO 700 pulls down the phase at the output of first stage 734 and affects node $N_1$ shown on FIG. 7 by causing the impedance at this node to become smaller as it is divided by the loop gain, which is $A(s)\beta_1(s)$, of the main loop. The parallel combination of $R_1$ and $R_2$ divides the loop gain of the main loop. The RFFC loop pushes the high pass pole to a higher frequency that is near but before the complex zero location, pulling back the gain and phase margin.

Figure 8:
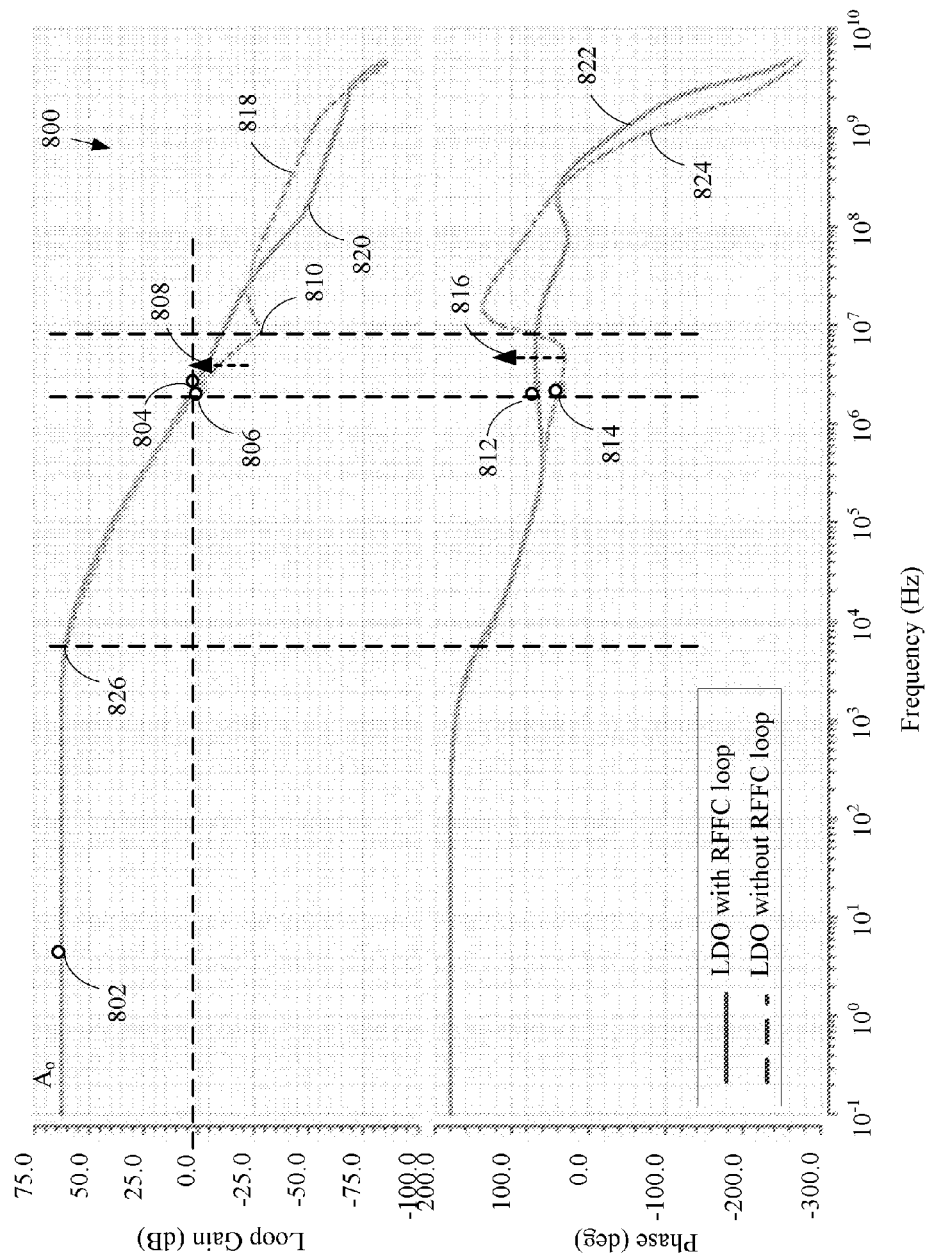
FIG. 8 is a Bode plot of the LDO regulator circuit of FIG. 7 for analyzing the effect of the replica feedback frequency compensation technique.

FIG. 8 is a Bode plot 800 that depicts the frequency responses of two LDO systems for comparatively analyzing the effect of the RFFC technique. Bode plot 800 shows two loop gain curves 818 and 820 and two phase shift curves 822 and 824. The loop gain (in decibels) and phase shift (in degrees) are indicated on the y-axis and the frequency (in Hertz) is indicated on the x-axis. Curves 820 and 822 correspond to LDO 700, which includes the RFFC loop, and curves 818 and 824 (shown in FIG. 8 as dashed curves) correspond to an LDO system that is similar to LDO 700, but does not have the RFFC loop.

FIG. 8 shows marker 802, which indicates that at 4.36 Hz the gain of both LDO systems is about 64.5 dB. Both LDO systems share a common dominant pole shown in plot 800 at marker 826. This dominant pole may be approximated to be the following:

$$\cong \frac{-1}{R_L C_{ext}}$$

$$= \frac{-I_{load}}{V_{out} C_{ext}}$$

The complex zero for LDO 700 is shown at marker 810, and may be approximated to be the following:

$$\pm \frac{j}{\sqrt{L_{est}C_{ext}}}$$

The unity gain bandwidth for LDO 700 is 2.88 MHz as indicated by marker 804, and for the LDO system without the RFFC loop, the unity gain frequency is 2.26 MHz as indicated by marker 806. At 2.88 MHz, the phase margin for LDO 700 is 67.75 degrees as indicated by marker 812. At 2.26 MHz, the phase margin for the LDO without the RFFC loop is 38.83 degrees as indicated by marker 814. Thus, LDO 700 has a better phase margin due to the RFFC loop. The effect of the RFFC loop (high pass pole) can be seen in FIG. 8. At low frequencies, the gain generally decreases. However, at higher frequencies, the RFFC loop causes the gain and phase to be pulled back as indicated by arrows 808 and 816, respectively.

Figure 9:
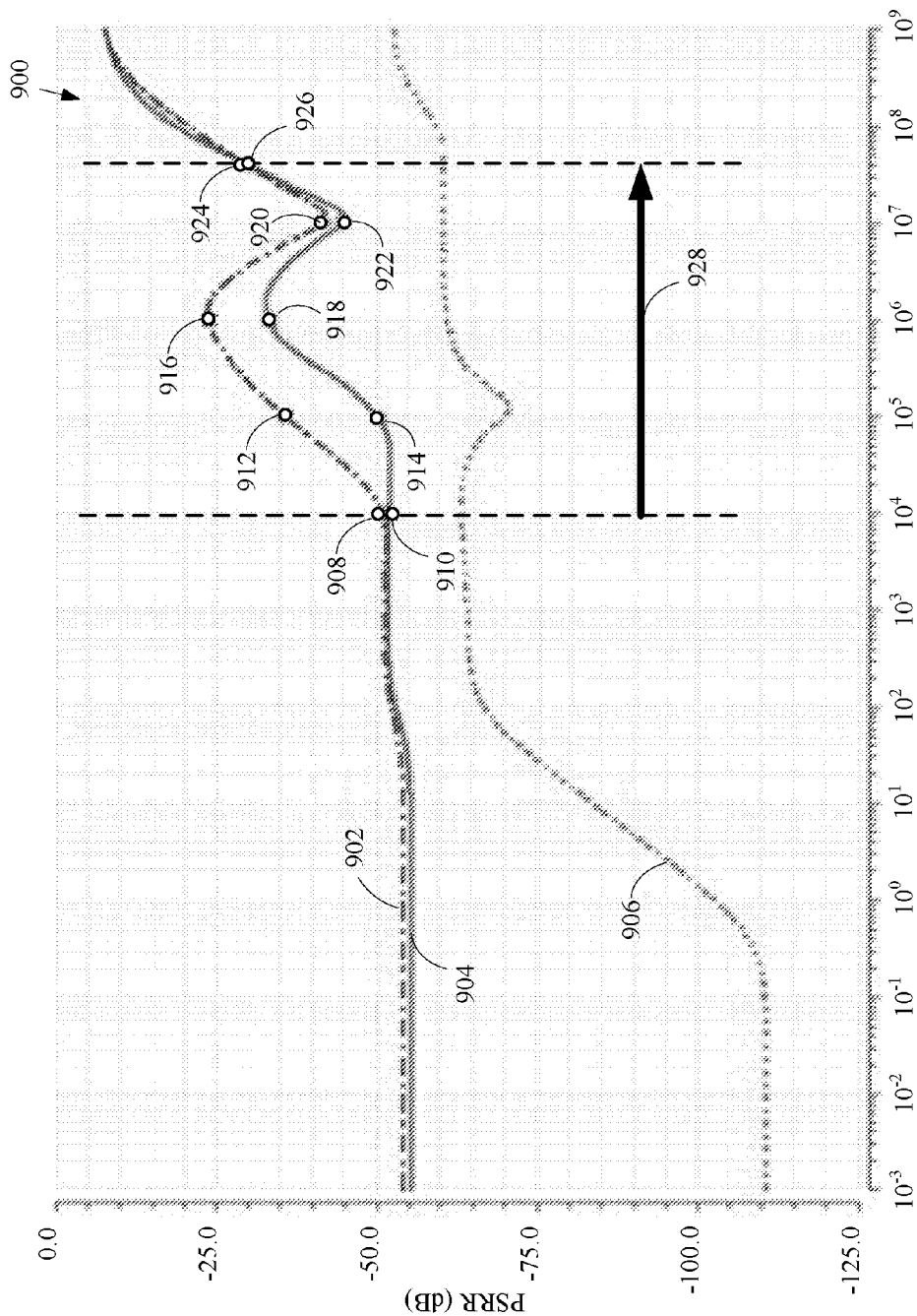
FIG. 9 is a plot for a comparative analysis of the effect of the replica feedback frequency compensation technique.

FIG. 9 is a plot of power supply noise rejection for LDO 700 for the purpose of analyzing the effect of the RFFC technique. In particular, FIG. 9 shows a plot 900 depicting a power supply rejection ratio (PSRR) curve 904 of LDO 700 (show in FIG. 7), which includes the RFFC loop, and of a PSRR curve 902 of LDO 400 (shown in FIG. 4) that does not include the RFFC loop. PSRR may be defined to be the magnitude (in decibels) of the gain from the positive power supply to the LDO output for low frequencies. An increase in PSRR means more attenuation of supply noise at the output. A bandgap reference curve 906 is shown in FIG. 9 for reference, and its effect on the LDO PSRR performance is assumed to be small enough to be negligible. The PSRR for both LDO systems was simulated using an output capacitor of 1 μF and midload current of 125 mA. A sampling of PSRR values for the two LDO systems are provided in Table 1 below.

TABLE 1

PSRR for LDO 700 (with RFFC loop) and LDO 400 (without RFFC loop)

| Frequency | PSRR for LDO 400 without RFFC loop | PSRR for LDO 700 with RFFC loop | PSRR improvement of LDO 700 over LDO 400 |
|---|---|---|---|
| @ 10 kHz | @ 908* −50.783 dB | @ 910* −51.775 dB | 0.99 dB |
| @ 100 kHz | @ 912* −35.786 dB | @ 914* −49.965 dB | 14.18 dB |
| @ 1 MHz | @ 916* −23.863 dB | @ 918* −33.210 dB | 9.35 dB |
| @ 10 MHz | @ 920* −41.408 dB | @ 922* −44.592 dB | 3.18 dB |
| @ 40 MHz | @ 924* −29.859 dB | @ 926* −30.097 | 0.24 dB |

*indicates marker number shown in FIG. 9

As shown in Table 1 above and in FIG. 9, the RFFC loop improves the PSRR of LDO 700 over the PSRR of LDO 400, especially in the high frequency range from 10 kHz to 40 Mhz as indicated by arrow 928 in FIG. 9.

Figure 10:
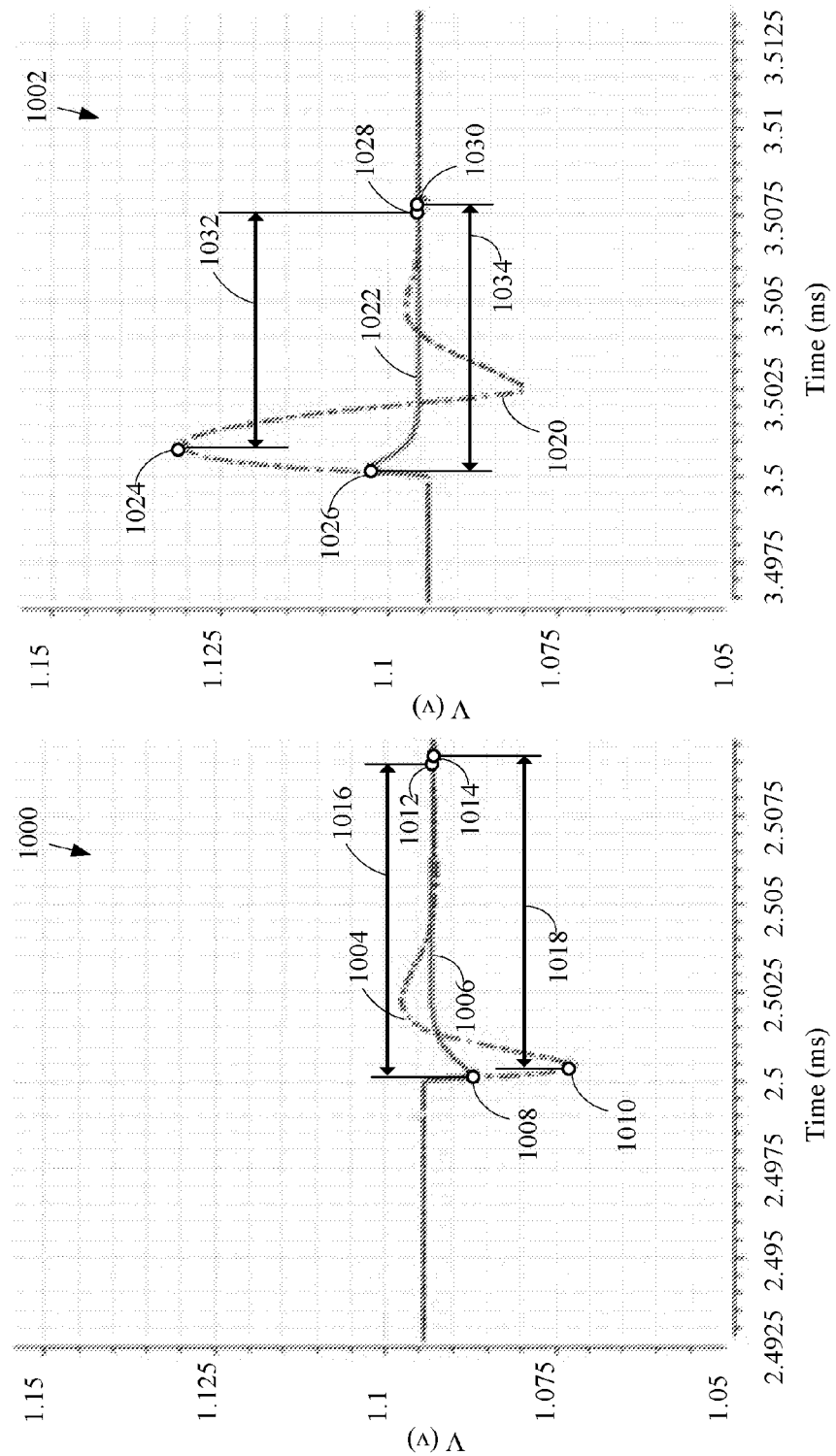
FIG. 10 illustrates the load transient response for a comparative analysis of the effect of the replica feedback frequency compensation technique.

FIG. 10 illustrates the load transient response of LDO 700 for analyzing the effect of the RFFC technique. FIG. 10 includes plot 1000 that shows the transient behavior from mid load to max load and plot 1002 that shows the transient behavior from max load to mid load. In both plots, the x-axis represents time (in milliseconds) and the y-axis represents voltage. The transient response was simulated using an output capacitor of 1 µF and midload current of 125 mA to max load current of 250 mA.

In plot 1000, a curve 1004 (shown as a dashed curve) depicts the transient behavior of LDO 400 (shown in FIG. 4) that does not include the RFFC loop, and a curve 1006 depicts the transient behavior of LDO 700 (shown in FIG. 7) that includes the RFFC loop. For curve 1006, the values at marker 1008 are (2.5001631 ms, 1.0872171 V) and the values at marker 1012 are (2.5092268 ms, 1.0929943 V). For curve 1004, the values at marker 1010 are (2.5004604 ms, 1.0731188 V) and the values at marker 1014 are (2.5094286 ms, 1.092894 V). For the time period indicated by arrow 1016, the change in time is 9.0636579 us and the change in voltage is 5.77721 mV or 637.40379 V/s. For the time period indicated by arrow 1018, the change in time is 8.9681955 us and the change in voltage is 19.77524 mV or 2.2050416 kV/s.

In plot 1002, curve 1020 (shown as a dashed curve) depicts the transient behavior of LDO 400 (shown in FIG. 4) that does not include the RFFC loop, and curve 1022 depicts the transient behavior of LDO 700 (shown in FIG. 7) that includes the RFFC loop. For curve 1022, the values at marker 1026 are (3.5002202 ms, 1.1024177 V) and the values at marker 1030 are (3.5079612 ms, 1.095358 V). For curve 1020, the values at marker 1024 are (3.5008586 ms, 1.130701 V) and the values at marker 1028 are (3.5076916 ms, 1.09552 V). For the time period indicated by arrow 1032, the change in time is 6.8329817 us and the change in voltage is 35.17503 mV or 5.1478307 kV/s. For the time period indicated by arrow 1034, the change in time is 7.7409638 us and the change in voltage is 7.0597 mV or 911.96194 V/s.

In comparing the two LDO systems, LDO 700 and LDO 400, the following parameters have been determined from the transient response curves of plots 1000 and 1002.

TABLE 2

Load Transient Response for LDO 700 (with RFFC loop) and LDO 400 (without RFFC loop)

|  | LDO 400 (without RFFC loop) | LDO 700 (with RFFC loop) | Load Transient Improvement due to RFFC loop |
| --- | --- | --- | --- |
| Dip settling time | 4.07 µs | 1.01 µs | 3.06 µs (75.2%) |
| Dip error | 19.78 mV | 5.78 mV | 14.00 mv (70.8%) |
| Overshoot settling time | 5.56 µs | 1.31 µs | 4.25 µs (76.4%) |
| Overshoot error | 35.18 mV | 7.06 mV | 28.12 mV (79.9%) |

As shown in Table 2 above, the RFFC technique improves the load transient parameters of LDO 700 by over 70%.

LDO 700 of FIG. 7 has many applications. For example, LDO 700 may be used as a standalone product to provide a stable, highly accurate and noise-free voltage to a load in a bigger system, or as an embedded architecture within a system on a chip (SOC) to provide local, noise-immune voltage regulation to power application-specific integrated circuit (ASIC).

Figure 11:
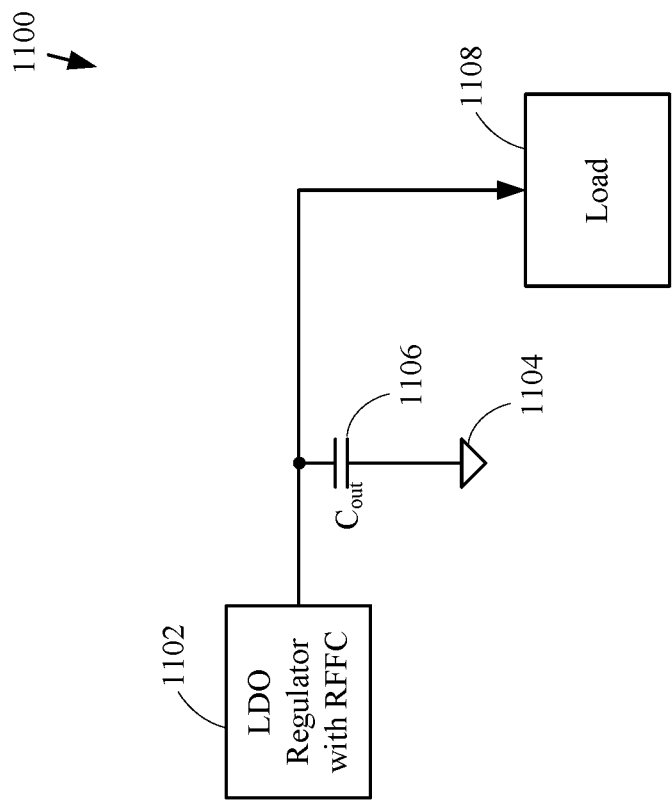
FIG. 11 illustrates a system that includes an LDO regulator with replica feedback frequency compensation and a small external output capacitor according to an example embodiment.

FIG. 11 illustrates a system 1100 that includes a low dropout regulator with replica feedback frequency compensation. System 1100 includes an LDO circuit 1102 and output capacitor 1106. System 1100 may include load 1108, which may be any analog or digital circuitry.

LDO circuit 1102 is a high power or high current rating LDO circuit configured to drive loads with a current of greater than 500 mA, thus LDO circuit 1102 is suitable for low power applications. LDO circuit 1102 may be similar or the same as LDO 700 in that LDO circuit 1102 includes an RFFC loop. Thus, for the sake of brevity, LDO circuit 1102 will not be further described.

Capacitor 1106 is externally connected to the output of LDO 1102 and ground voltage 1104. Capacitor 1106 may be any type of capacitor, such as ceramic, tantalum, or aluminum electrolytic. Ceramic capacitors are commonly used because of their low cost and smaller footprint size. However, depending on the application, other types of capacitors may be used. For example, at high frequency, the performance of a capacitor may be poor because of its effective series inductance. Thus, when electrolytic or tantalum capacitors are utilized, a small ceramic capacitor may be added in parallel to enable bypassing of the electrolytic or tantalum capacitance, thereby extending the useful frequency range of the external capacitance. While not shown in FIG. 11, system 1100 may include more capacitors than just capacitor 1106, for example, bypass capacitors.

Capacitor 1106 may be of any size/capacitance. The capacitance may be proportional to the current rating of the LDO, such that the higher the current rating, the higher the capacitance may be required. For example, if the current rating for the LDO is 500 mA, the capacitance of capacitor 1106 may be 1-2.2 µf; if the current rating is 250 mA, the capacitance may be 0.5-1 µf; or if the current rating is 1 A, then the capacitance may be 4.7 µf. Due to the stabilizing effect of the RFFC loop in LDO 1102, capacitor 1106 generally does not need to be a large capacitor. In other words, capacitor 1106 may have a capacitance of 4 µF or less, for example, 3.3 µf or 2.2 µf.

In an embodiment, a method for using replica feedback frequency compensation in a low-dropout regulator is provided. The method includes, in a first stage of the LDO, receiving a reference voltage and a feedback voltage and outputting a first output voltage, generating a second output voltage from the first output voltage at a second stage of the LDO regulator, generating a third output voltage from the second output voltage at a third stage of the LDO regulator, wherein the third output voltage is an output voltage of the LDO. The method further includes generating a fourth output voltage from the second output voltage at a fourth stage. Furthermore, in a feedback stage, generating a feedback voltage that is controlled by a first feedback factor of a main loop and a second feedback factor of a replica feedback frequency compensation loop of the low dropout regulator circuit. The method further includes coupling a small capacitor (e.g., less than 4 microfarads) to the output of the LDO to provide enhanced stability.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A low dropout regulator circuit, comprising:
a first stage having a reference voltage as a first input and a feedback voltage as a second input, the first stage generating a first output voltage;

a second stage configured to receive the first output voltage and to generate a second output voltage;

a third stage configured to receive the second output voltage and to generate a third output voltage, the third output voltage being an output voltage at an output terminal of the low dropout regulator circuit;

a fourth stage configured to receive the second output voltage and to generate a fourth output voltage; and a feedback stage configured to receive the fourth output voltage and the third output voltage and to generate a feedback voltage that is controlled by a first feedback factor of a main loop and a second feedback factor of a replica feedback frequency compensation (RFFC) loop of the low dropout regulator circuit.

2. The low dropout regulator circuit of claim 1, wherein the first stage comprises an amplifier having a first input connected to the feedback voltage, a second input connected to the reference voltage, and an output that generates the first output voltage.

3. The low dropout regulator circuit of claim 1, wherein the second stage comprises a first transistor and a second transistor, the first transistor having a source terminal, a drain terminal, and a gate terminal, the source terminal of the first transistor being connected to a ground voltage, and the gate terminal of the first transistor being connected to the first output voltage, and the second transistor having a source terminal, a gate terminal, and a drain terminal, the source terminal of the second transistor being connected to a supply voltage, the drain terminal of the second transistor being connected to the drain terminal of the first transistor, and the gate terminal of the second transistor being connected to the drain terminal of the second transistor and the third stage.

4. The low dropout regulator circuit of claim 3, wherein the first and second transistors are a pair of complementary metal oxide semiconductor transistors.

5. The low dropout regulator circuit of claim 4, wherein the first transistor is an n-channel metal oxide semiconductor (nMOS) transistor and the second transistor is a p-channel metal oxide semiconductor (pMOS) transistor.

6. The low dropout regulator circuit of claim 1, wherein the third stage comprises a transistor having a source terminal, a drain terminal, and a gate terminal, the source terminal being connected to a supply voltage, the drain terminal being connected to the output terminal of the low dropout regulator circuit, and the gate terminal being connected to the second output voltage.

7. The low dropout regulator circuit of claim 6, wherein the transistor is a p-channel metal oxide semiconductor (pMOS) transistor.

8. The low dropout regulator circuit of claim 1, wherein the fourth stage comprises a transistor having a source terminal, a drain terminal, and a gate terminal, the source terminal being connected to a supply voltage, the drain terminal being connected to a resistor that has a terminal connected to a ground voltage, and the gate terminal being connected to the second output voltage.

9. The low dropout regulator circuit of claim 8, wherein the transistor is a p-channel metal oxide semiconductor (pMOS) transistor.

10. The low dropout regulator circuit of claim 1, wherein the first feedback factor is determined by a first feedback circuit comprising a first resistor, a second resistor, a first capacitor, and a second capacitor, the first and second resistors being connected at a first node and in series between the output terminal of the low dropout regulator circuit and a ground terminal, the first and second capacitors being connected at a second node and in series between the output terminal and the ground terminal, the first node being shorted to the second node.

11. The low dropout regulator circuit of claim 10, wherein the second feedback factor is determined by the first feedback circuit and another feedback circuit that comprises a third resistor and a third capacitor, the third resistor being connected to the third capacitor and the ground terminal, and the third capacitor being connected to the third resistor and the second node.

12. A system, comprising:

a low dropout regulator circuit that comprises a first stage having a reference voltage as a first input and a feedback voltage as a second input, the first stage generating a first output voltage;

a second stage configured to receive the first output voltage and to generate a second output voltage;

a third stage configured to receive the second output voltage and to generate a third output voltage, the third output voltage being an output voltage at an output terminal of the low dropout regulator circuit;

a fourth stage configured to receive the second output voltage and to generate a fourth output voltage; and a feedback stage configured to receive the fourth output voltage and the third output voltage and to generate a feedback voltage that is controlled by a first feedback factor of a main loop and a second feedback factor of a replica feedback frequency compensation (RFFC) loop of the low dropout regulator circuit; and an output capacitor connected to the output terminal of the low dropout regulator circuit.

13. The system of claim 12, wherein the low dropout regulator circuit is configured to drive loads with a current rating of greater than 500 milliamperes and wherein the output capacitor has a capacitance that is proportional to the current rating.

14. The system of claim 12, wherein the first stage comprises an amplifier having a first input connected to the feedback voltage, a second input connected to the reference voltage, and an output that generates the first output voltage.

15. The system of claim 12, wherein the second stage comprises a first transistor and a second transistor, the first transistor having a source terminal, a drain terminal, and a gate terminal, the source terminal of the first transistor being connected to a ground voltage, and the gate terminal of the first transistor being connected to the first output voltage, and the second transistor having a source terminal, a gate terminal, and a drain terminal, the source terminal of the second transistor being connected to a supply voltage, the drain terminal of the second transistor being connected to the drain terminal of the first transistor, and the gate terminal of the second transistor being connected to the drain terminal of the second transistor and the third stage.

16. The system of claim 12, wherein the third stage comprises a transistor having a source terminal, a drain terminal, and a gate terminal, the source terminal being connected to a supply voltage, the drain terminal being connected to the output terminal of the low dropout regulator circuit, and the gate terminal being connected to the second output voltage.

17. The system of claim 12, wherein the fourth stage comprises a transistor having a source terminal, a drain terminal, and a gate terminal, the source terminal being connected to a supply voltage, the drain terminal being connected to a resistor that has a terminal connected to a ground voltage, and the gate terminal being connected to the second output voltage.

18. The system of claim 12, wherein the first feedback factor is determined by a first feedback circuit comprising a first resistor, a second resistor, a first capacitor, and a second capacitor, the first and second resistors being connected at a first node and in series between the output terminal of the low dropout regulator circuit and a ground terminal, the first and second capacitors being connected at a second node and in series between the output terminal and the ground terminal.

19. The system of claim 18, wherein the second feedback factor is determined by the first feedback circuit and another feedback circuit that comprises a third resistor and a third capacitor,
- the third resistor being connected to the third capacitor and the ground terminal, and
- the third capacitor being connected to the third resistor and the second node.

20. A low dropout regulator circuit, comprising:
- an amplifier comprising a first input, a second input, and an output, the first input being connected to a voltage reference, the second input being connected to a feedback circuit, and the output being connected to a gate terminal of a first transistor;
- the first transistor having a source terminal, a drain terminal, and a gate terminal, the source terminal of the first transistor being connected to a ground terminal, the drain terminal of the first transistor being connected to a drain terminal of a second transistor, the gate terminal of the first transistor being connected to the output of the amplifier;
- the second transistor having a source terminal, a gate terminal, and a drain terminal, the source terminal of the second transistor being connected to a supply voltage terminal and the gate terminal of the second transistor being connected to the drain terminal of the first transistor;
- a third transistor having a source terminal, a drain terminal, and a gate terminal, the source terminal of the third transistor being connected to the supply voltage terminal, the gate terminal of the third transistor being connected to the gate terminal of the second transistor, and the drain terminal of the third transistor being connected to an output terminal of the low dropout regulator circuit;
- a fourth transistor having a source terminal, a drain terminal, and a gate terminal, the source terminal of the fourth transistor being connected to the supply voltage terminal, the drain terminal of the fourth transistor being connected to a third resistor, and the gate terminal of the fourth transistor being connected to the gate terminal of the second transistor; and
- a feedback circuit comprising a first resistor, a second resistor, the third resistor, a first capacitor, a second capacitor and a third capacitor,
  - the first and second resistors being connected at a first node and in series between the output voltage terminal and a ground terminal,
  - the first and second capacitors being connected at a second node and in series between the output voltage terminal and a ground terminal,
  - the second node of the feedback circuit being connected to the second input of the amplifier,
  - the third resistor being connected to the third capacitor and the ground terminal, and
  - the third capacitor being connected to the third resistor and the second node.

* * * * *

UNITED STATES PATENT AND TRADEMARK OFFICE
CERTIFICATE OF CORRECTION

PATENT NO.        : 9,740,225 B1                                        Page 1 of 1
APPLICATION NO.   : 15/136792
DATED             : August 22, 2017
INVENTOR(S)       : Kian Tiong Wong It is certified that error appears in the above-identified patent and that said Letters Patent is hereby corrected as shown below:

In Column 22, Line 15, in Claim 12 replace "regulator circuit that comprises" with --regulator circuit that comprises:--.

Signed and Sealed this
Twenty-fourth Day of April, 2018

Andrei Iancu
*Director of the United States Patent and Trademark Office*